(12) United States Patent
Heimo

(10) Patent No.: US 7,576,412 B2
(45) Date of Patent: Aug. 18, 2009

(54) WAFER WITH IMPROVED SAWING LOOPS

(75) Inventor: Scheucher Heimo, Vienna (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/572,753

(22) PCT Filed: Jul. 20, 2005

(86) PCT No.: PCT/IB2005/052428

§ 371 (c)(1),
(2), (4) Date: Jan. 26, 2007

(87) PCT Pub. No.: WO2006/013508

PCT Pub. Date: Feb. 9, 2006

(65) Prior Publication Data

US 2008/0001259 A1    Jan. 3, 2008

(30) Foreign Application Priority Data

Jul. 26, 2004    (EP) ................................ 04103570

(51) Int. Cl.
*H01L 23/544* (2006.01)

(52) U.S. Cl. .............................. 257/620; 257/E23.123; 257/E23.194

(58) Field of Classification Search ................ 257/620, 257/E23, 116, E23.123, E23.194, E21.237
See application file for complete search history.

(56) References Cited

U.S. PATENT DOCUMENTS

| 6,465,872 B2 * | 10/2002 | Tada .......................... 257/620 |
| 6,492,247 B1 | 12/2002 | Guthrie et al. |
| 2002/0016033 A1 * | 2/2002 | Bergler et al. ............... 438/200 |

FOREIGN PATENT DOCUMENTS

JP    10 164522 A1    9/1998

OTHER PUBLICATIONS

"PCT International Search Report with mailing date, Feb. 6, 2006, (International Application No. PCT/ IB2005/052428)".
Patent Abstracts of Japan. Publication No. 10-163522; Application No. 08-319286 titled, "Manufacture of LED Array," Jun. 19, 1998.

* cited by examiner

*Primary Examiner*—Minh-Loan T Tran
*Assistant Examiner*—W. Wendy Kuo

(57) ABSTRACT

In a wafer (1) with chips (2) and elongate separating zones (4) between the chips (2), each chip (2) comprises at least one sawing loop (6), which sawing loop (6) comprises two protecting strips (17, 18) projecting from a planar protecting layer (16) of the chip (2), wherein said protecting strips (17, 18) are widened by means of wider strip portions (26, 27, 28, 29) where they emerge from the planar protecting layer (16), and wherein the protecting strips (17, 18) and the planar protecting layer (16) are provided with weak spots (31, 32, 34) serving as envisaged breakage points.

15 Claims, 2 Drawing Sheets

WAFER WITH IMPROVED SAWING LOOPS

FIELD OF THE INVENTION

The invention relates to a wafer with chips, which chips each have a given chip surface area and chip boundaries, and with elongate separating zones between the chips, which separating zones are provided for breaking through the wafer for separating off the chips, and wherein each chip comprises at least one connection line, which connection line projects from the chip at a chip boundary, issues into a separating zone adjoining the chip, is electrically conductive before a separation of the wafer in the adjoining separating zone, can be interrupted upon a separation of the wafer in the adjoining separating zone, and comprises two mutually adjoining conductor portions, which two mutually adjoining conductor portions project beyond the chip boundary into the adjoining separating zone and are electrically conductively interconnected by means of a connecting portion, and wherein each chip is covered with a planar protecting layer, and the surface area of the planar protecting layer corresponds to the chip surface area, and wherein at least one protecting strip is provided for each connection line of each chip, which protecting strip projects from the planar protecting layer at the chip boundary of the respective chip and enters the adjoining separating zone so as to cover the two mutually adjoining conductor portions.

The invention further relates to a chip, which chip has a given chip surface area and chip boundaries, and wherein the chip comprises a remnant of at least one connection line, which remnant projects from the chip at a chip boundary and consists of the remnants of two mutually adjoining conductor portions, which two remnants of the two mutually adjoining conductor portions project from the chip, and wherein the chip is covered with a planar protecting layer, and the surface area of the planar protecting layer corresponds to the chip surface area, and wherein for the remnant of each connection line of the chip the remnant of at least one protecting strip is provided, which remnant of the at least one protecting strip projects from the planar protecting layer at the chip boundary of the respective chip so as to cover the remnants of the two mutually adjoining conductor portions.

BACKGROUND OF THE INVENTION

Such a wafer of the kind mentioned in the opening paragraph and such a chip of the kind mentioned in the second paragraph have been marketed by applicant in various embodiments and are accordingly known. In the known wafer, the connection lines are formed by conductor tracks in a known manner, which conductor tracks are substantially U-shaped and comprise two mutually adjoining conductor track portions as the mutually adjoining conductor portions, such that the two mutually adjoining conductor track portions of different connection lines may indeed have different widths so as to achieve different conductor track resistance values, but still all conductor track portions have a constant width. Furthermore, the known wafer is constructed such that the protecting strips covering the conductor tracks also have a constant width all along their strip extensions. This has the consequence that substantially right-angled corners are present in those locations of the wafer where two mutually adjoining protecting strips project from the planar protecting layer for the chip at the chip boundary of this chip. The elongate separating zones between the chips have a comparatively great width in the known wafer, the width of the elongate separating zones being 100 µm, 80 µm, or 70 µm, depending on the embodiment of the known wafer. As long as the elongate separating zones between the chips have the width mentioned above, no problems with fracture zones in the wafer usually occur during separating of the wafer along the elongate separating zones in the regions of the transitions of the mutually adjoining protecting strips and the mutually adjoining conductor portions.

If the elongate separating zones are to be considerably narrower, however, i.e. the widths of the elongate separating zones should lie at values of 40 µm, 30 µm, 20 µm or 10 µm so as to achieve the advantage of a better utilization of the wafer surface, then problems arise if no special measures are taken. Tests carried out on wafers having such substantially narrower separating zones have shown that fracture zones caused by separating of the wafer disadvantageously occur much more frequently in the known constructions of the mutually adjoining conductor portions and the mutually adjoining protecting strips of these wafers. This problem is aggravated by the envisaged, and indeed realized wafer thicknesses. Standard wafers provided for a plastic assembly usually require a wafer thickness of 200 µm to 380 µm. More advanced chip packaging applications, however, require wafer thicknesses of 180 µm, 150 µm, and 120 µm. Wafer thicknesses of 180 µm, 150 µm, and 120 µm, and recently even 50 µm, are also required for chip card ICs. Chips for paper applications require wafer thicknesses of 50 µm, 40 µm, down to 20 µm. Given such thin wafers, the occurrence of fracture zones (cracks) at the connection lines (sawing loops) is highly critical, because the fracture zones can propagate much more quickly and easily in the thin wafer, especially in bending processes, than is the case for thick wafers. These fracture zones usually start in the vicinity of the free ends of the remnants of the protecting strips present after separating of the wafer and oft extend relatively deeply into the chips.

OBJECT AND SUMMARY OF THE INVENTION

The invention has for its object to solve the above problem of fragility and to provide an improved wafer and an improved chip.

To achieve the object mentioned above, inventive features are provided in a wafer according to the invention, such that a wafer according to the invention can be characterized as follows:

A wafer with chips, which chips each have a given chip surface area and chip boundaries, and with elongate separating zones between the chips, which separating zones are provided for breaking through the wafer for separating off the chips, and wherein each chip comprises at least one connection line, which connection line projects from the chip at a chip boundary, issues into a separating zone adjoining the chip, is electrically conductive before a separation of the wafer in the adjoining separating zone, can be interrupted upon a separation of the wafer in the adjoining separating zone, and comprises two mutually adjoining conductor portions, which two mutually adjoining conductor portions project beyond the chip boundary into the adjoining separating zone and are electrically conductively interconnected by means of a connecting portion, and wherein each chip is covered with a planar protecting layer, and the surface area of the planar protecting layer corresponds to the chip surface area, and wherein at least one protecting strip is provided for each connection line of each chip, which protecting strip projects from the planar protecting layer at the chip boundary of the respective chip and enters the adjoining separating zone so as to cover the two mutually adjoining conductor portions, and wherein the at least one protecting strip has a strip portion that is wider than the remaining portion of the protecting strip at at least one side of the protecting strip in its region that adjoins the planar protecting layer.

To achieve the object mentioned above, inventive features are provided in a chip according to the invention such that a chip according to the invention can be characterized as follows:

A chip, which chip has a given chip surface area and chip boundaries, and wherein the chip comprises a remnant of at least one connection line, which remnant projects from the chip at a chip boundary and consists of the remnants of two mutually adjoining conductor portions, which two remnants of the two mutually adjoining conductor portions project from the chip, and wherein the chip is covered with a planar protecting layer, and the surface area of the planar protecting layer corresponds to the chip surface area, and wherein for the remnant of each connection line of the chip the remnant of at least one protecting strip is provided, which remnant of the at least one protecting strip projects from the planar protecting layer at the chip boundary of the respective chip so as to cover the remnants of the two mutually adjoining conductor portions, and wherein the remnant of the at least one protecting strip has a strip portion that is wider than the remaining portion of the respective remnant at at least one side of the remnant in its region adjoining the planar protecting layer.

The inventive features achieve a mechanical protection function in a very simple manner without practically any additional expenditure by means of the at least one widened strip portion of the at least one protecting strip, because the changes of reaction forces occurring in the wafer, in particular increases in reaction forces, are kept away from the chips and are diverted into the elongate separating zones during the severing of the at least one protecting strip and the subjacent conductor portions, which changes in reaction forces take place during separating of the wafer, which is preferably achieved in a cutting process by means of a special sawing blade, or by means of a laser or by other suitable means, for example in an etching process, so that fracture zones in the wafer caused by such increases in the reaction forces, if present, occur only within the elongate separating zones and accordingly cause no disadvantageous fracture zones within the chips. Intensive experiments have shown that the measures according to the invention reduce to a very low level the number of individual chips according to the invention in which the separation along the elongate separating zones has led to a chip crack, i.e. a fracture zone extending into the interior of a chip. The relevant reject rate lies in a range of at most a few parts per million (ppm).

It was found to be highly advantageous in a wafer according to the invention when two mutually adjoining protecting strips are provided for each connection line of each chip, which two mutually adjoining protecting strips project from the planar protecting layer at the chip boundary of the respective chip and enter the adjoining separating zone, thus covering the two mutually adjoining conductor portions and being connected to one another in the separating zone by means of a protecting portion, which protecting portion covers the connecting portion, and when each of the two protecting strips has a strip portion that is wider than the remaining region of the protecting strip at at least one side of the protecting strip in its region adjoining the planar protecting layer. This is advantageous in that the period of time required for separating, preferably cutting through, of the chip components provided for protection, i.e. the two protecting strips that are substantially narrower than only a single protecting strip, is very short, which is found to be advantageous.

In a wafer according to the invention, the widened strip portion of a protecting strip may be provided at one side of the protecting strip, which side faces away from the adjoining protecting strip. The widened strip portions in a wafer according to the invention may be provided at the same side of the protecting strip in relation to the protecting strips, in which case it is advantageous to provide the widened strip portions at that side of the protecting strips that is severed first in a separating process. It was found to be highly advantageous, however, in a wafer according to the invention when each protecting strip has a strip portion that is wider than the remaining region of the protecting strip at both sides of the protecting strip in its region adjoining the planar protecting layer. This provides a particularly high and reliable protection function against chip fractures caused by the severing of the wafer along the elongate separating zones.

In a wafer according to the invention, each widened strip portion may have the shape of a rectangle or a square or a circular segment. Such a circular segment being bounded by a circular arc. A segment boundary along an ellipsoidal arc is also possible. It was found to be highly advantageous when each widened strip portion is realized in triangular form. Such a construction was found to be particularly favorable in experiments, owing to the fact that the reaction force increases exerted on the chips are particularly effectively diverted.

It was furthermore found to be highly advantageous in a wafer according to the invention when a weak spot traversing the protecting strip is realized in each protecting strip. The creation of such weak spots in effect provides envisaged fracture locations, whereby it is advantageously achieved that fracture zones caused by any strong reaction force increases that may occur will take place in the regions of the envisaged fracture locations thus provided, i.e. in the regions of the elongate separating zones, so that they are kept away from the chips in a particularly reliable manner.

The advantages of advantageous further embodiments of a wafer according to the invention as described above equally apply to advantageous further embodiments of a chip according to the invention.

The above and further aspects of the invention will become apparent from descriptions of embodiments in which these embodiments are explained in more detail.

BRIEF DESCRIPTION OF THE DRAWINGS

The invention will be explained in more detail below with reference to two embodiments shown in the drawings, to which embodiments, however, the invention is by no means limited.

DESCRIPTION OF EMBODIMENTS

Figure 1:
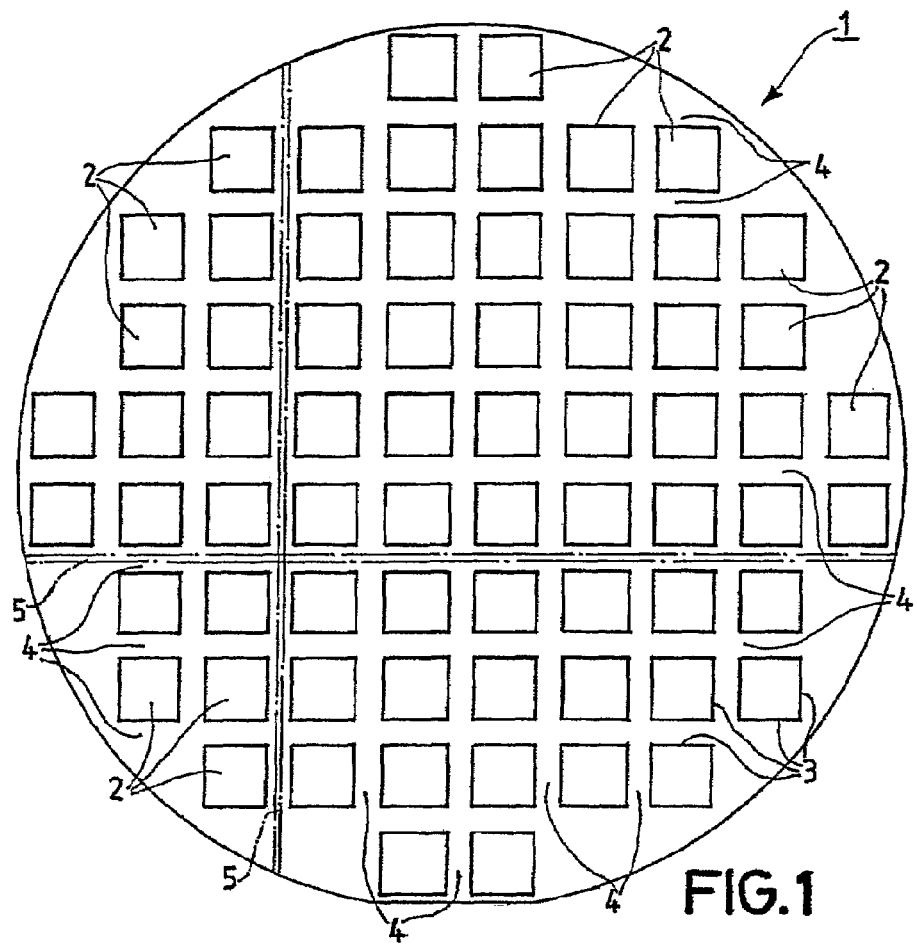
FIG. 1 is a diagrammatic plan view of a wafer with chips and with elongate separating zones between the chips.

FIG. 1 shows a wafer 1 which comprises a plurality of chips 2. The chips 2 are shown diagrammatically only and without any further details in FIG. 1. Each chip 2 has a given chip surface area, which chip surface area lies within chip boundaries 3. In the example shown, the chip surface area of each chip 2 is square in shape, such that the chip boundaries 3 are of the same length. Rectangular chip surface areas are also possible and known. The chip surface areas and the chip boundaries 3 of each chip 2 have been defined in known manner by exposure fields which are generated in the manufacture of the chips by means of irradiation masks.

Narrow, elongate separating zones 4 are provided between the chips 2. The separating zones 4 are designed for breaking up the wafer 1 so as to obtain the individual chips 2. The breaking-up of the wafer 1 takes place along sawing lanes 5 in the present case, only two sawing lanes 5 being indicated in FIG. 1 with dash-dot lines. The wafer 1 can be broken along the sawing lanes 5, special saw blades being used for the separation. Instead of saw blades, a laser cutting device or some other cutting device may be alternatively used. The separation may also be achieved by means of an etching process.

Each chip on the wafer 1 has a plurality of connection lines 6, which connection lines 6 are not shown in FIG. 1 for reasons of clarity. Such a connection line 6 is shown in FIG. 2, which will be described below.

Figure 2:
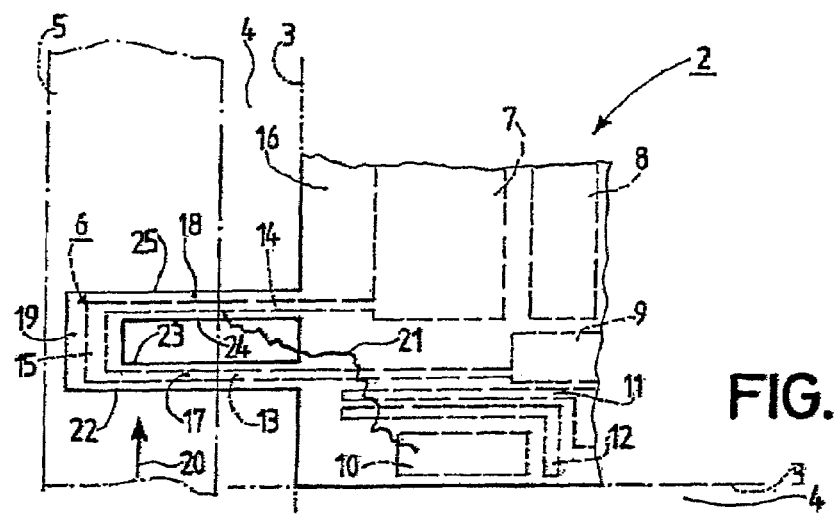
FIG. 2 shows part of a chip according to the prior art on a much larger scale than in FIG. 1.

FIG. 2 shows a portion of a chip 2, whose two chip boundaries 3 visible in FIG. 2 are indicated with dash-dot lines. The two separating zones 4 extend alongside the two chip boundaries 3 visible in FIG. 2. In the one separating zone 4 extending from top to bottom in FIG. 2, the sawing lane 5 belonging to this separating zone 4 is indicated with a dash-dot line. The chip 2 has a first circuit portion 7 and a second circuit portion 8 and a third circuit portion 9 and a fourth circuit portion 10 and a first conductor track 11 and a second conductor track 12, which circuit portions and conductor tracks of the chip 2 are visible in FIG. 2. Obviously, the chip 2 comprises a plurality of further circuit portions and conductor tracks.

As was noted above, the chip 2 comprises a plurality of connection lines 6. Such a connection line 6 is visible in FIG. 2. The connection line 6 projects from the chip 2 at a chip boundary 3 and enters a separating zone 4 adjoining the chip 2. The connection line 6 is initially electrically conductive, i.e. before a separation of the wafer 2 along the sawing lane 5 in the separating zone 4 that extends from top to bottom in FIG. 2 and adjoins the chip 2. The connection line 6 can be interrupted during a separation of the wafer 1 along the sawing lane 5 in the separating zone 4 extending from top to bottom in FIG. 2 and adjoining the chip 2, i.e. in that the connection line 6 is cut through or severed.

The connection line 6 comprises two mutually adjoining conductor portions, i.e. a first conductor portion 13 and a second conductor portion 14. The two mutually adjoining conductor portions 13, 14 project beyond the chip boundary 3 into the separating zone 4 that extends from top to bottom in FIG. 2 and adjoins the chip 2. In this separating zone 4, the two conductor portions 13, 14 are electrically conductively interconnected by a connecting portion 15. The connection line 6 has a U-shape in the present case. The first conductor portion 13 of the connection line 6 is connected to the third circuit portion 9, and the second conductor portion 14 is connected to the first circuit portion 7. The first circuit portion 7 and the third circuit portion 9 here form part of a test device of the chip 2. The test device serves to test an error-free operation of at least a portion of the chip 2, which operation is tested before the chip 2 is separated off. After a test has been carried out on the error-free operation, the test device should be put out of action reliably, which takes place during the separating-off of the chip 2 in that the connection line 6 is interrupted. Such a connection line 6 is also denoted a sawing loop in the art. Such connection lines 6 are also provided for other circuit portions and functions of the chip 2, for example, a programming device may be provided instead of a test device. Such connection lines 6 may alternatively be provided in combination with pads of an IC, which pads have to be made inoperative after the IC has been completed so as to avoid undesirable short-circuits.

The chip 2 is covered by a planar protecting layer 16, often denoted passivating layer in the art. The planar protecting layer 16 is made of nitride in the present case, which has also long been known. The chip 2 comprises two mutually adjoining protecting strips for the connection line 6, i.e. a first protecting strip 17 and a second protecting strip 18. The two mutually adjoining protecting strips 17 and 18 are made of nitride in the present case, as is the planar protecting layer 16, which has also long been known. The two mutually adjoining protecting strips 17 and 18 project from the planar protecting layer 16 at the chip boundary 3 of the chip 2 and enter the separating zone 4 that extends from top to bottom in FIG. 2 and adjoins the chip 2. The two mutually adjoining protecting strips 17 and 18 here cover the two mutually adjoining conductor portions 13, 14 of the connection line 6, and the two mutually adjoining protecting strips 17 and 18 are interconnected by a protecting portion 19 in the separating zone 4 extending from top to bottom in FIG. 2. The protecting portion 19 covers the connecting portion 15 of the connection line 6.

FIG. 2 shows a chip 2 according to the prior art. In the chip 2 of FIG. 2, the two conductor portions 13 and 14 and the two protecting strips 17, 18 are of constant width along their total longitudinal dimensions. It was found in this known construction that a separation of the wafer 1 in the separating zone 4 extending from top to bottom in FIG. 2, for which the saw blade (not shown) is moved along the sawing lane 5 in the direction of an arrow 20, may comparatively easily lead to the formation of a fracture zone 21, which extends from the separating zone 4, i.e. from the region of the severed conductor portions 13, 14 and the severed protecting strips 17, 18 disadvantageously into the chip 2 itself, which leads to a destruction of circuit portions or conductor tracks in the chip 2, as is visualized by the fracture zone 21 indicated in FIG. 2. To avoid such fracture zones 21 entering into the chip 2, therefore, all that can be done according to the prior art is to dimension the separating zones 4 so wide that fracture zones 21 penetrate a chip 2 only very occasionally. This has the disadvantage that comparatively wide separating zones 4 must be provided in an arrangement according to the prior art, which leads to an undesirable waste of expensive wafer material.

Figure 3:
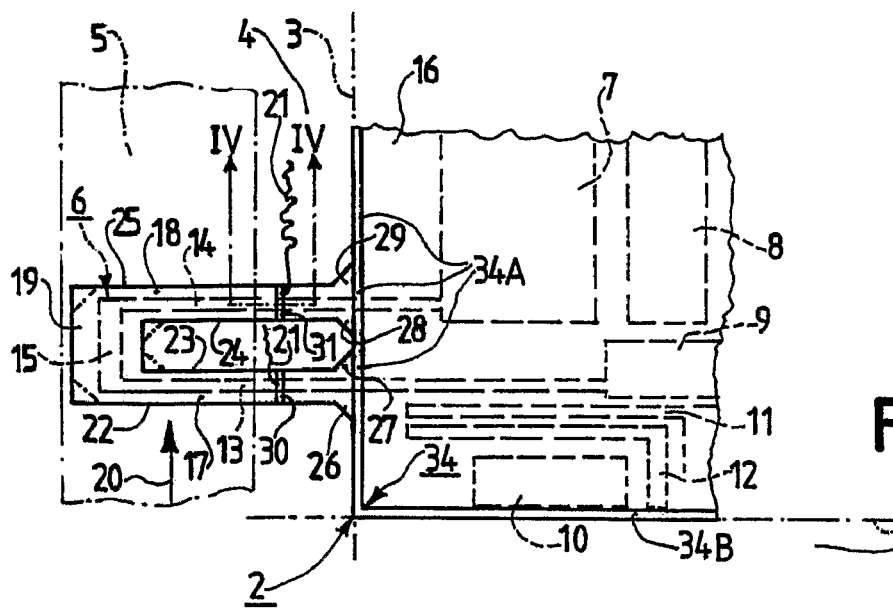
FIG. 3 shows in the same manner as FIG. 2 part of a chip in a first embodiment of the invention.

FIG. 3 shows a construction of a chip 2 according to the invention, which chip 2 is the result of the separation from a wafer according to the invention, and in which chip 2 the problems described above have been eliminated or strongly reduced down to an acceptable level. In the chip 2 of FIG. 3, each protecting strip 17, 18 has a strip portion 26, 27 and 28, 29 that is wider than the remaining portion of the respective protecting strip 17, 18 at both sides 22, 23 and 24, 25 of the respective protecting strip 17, 18 in its region adjoining the planar protecting layer 16. Each widened strip portion 26, 27 and 28, 29 has a triangular shape here, more exactly an equilateral triangular shape the widened strip portion 26, 27 and 28, 29 may alternatively be rectangular or square or in the shape of a circular sector.

Figure 4:
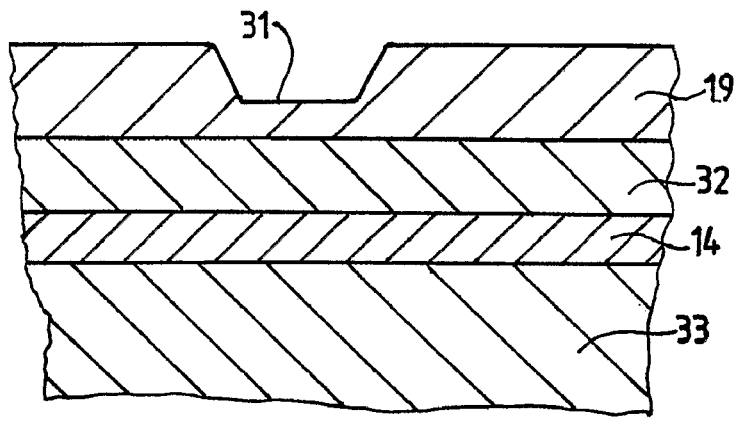
FIG. 4 shows on a much larger scale than FIG. 3 a portion of the chip of FIG. 3 in a cross-section taken on the line IV-IV.

In the construction of the chip 2 of FIG. 3, a weak spot traversing the protecting strip 17, 18 is realized in each of the two protecting strips 17, 18, i.e. a first weak spot 30 and a second weak spot 31. The second weak spot 31 provided in the second protecting strip 18 is clearly visible in FIG. 4. The second weak spot 31 is realized in that a smaller layer thickness is realized in the manufacture of the second protecting strip 18 in the region of the second weak spot 31. The same holds for the first weak spot 30. It should be noted that the second conductor portion 14 is also visible in FIG. 4. An intermediate layer 32 is provided between the second protecting strip 18 and the second conductor portion 14. Part of the substrate 33 of the wafer is shown below the second conductor portion 14 in FIG. 4.

In the chip 2 of FIG. 3, furthermore, an additional weak spot 34 is provided in the planar protecting layer 16 along the chip boundaries 3 of the chip 2, two weak spot portions 34A and 34B of this additional weak spot 34 being visible in FIG. 3. This additional weak spot 34 extending along the chip boundaries 3 provides a substantial additional contribution to the protection function for the chip 2, i.e. in keeping away fracture zones or chip cracks from the chip region proper.

It was found in many series of experiments with the chip 2 of FIG. 3 that the fracture zones that may be caused upon a severing of the wafer for separating the chips 2, which is done in that a saw blade is moved in the direction of the arrow 20 along the sawing lane 5, preferentially issue from the weak spots 30, 31 provided in the protecting strips 17, 18 and practically exclusively extend in a separating zone 4, and accordingly enter a chip 2 very seldom only. The reject rate of chips owing to fracture zones 21 entering a chip upon separating of the wafer could be reduced by approximately 10% by means of the measures according to the invention.

It should be noted here that the construction of the chip 2 of FIG. 3 is also possible in a modified form, i.e. in that beveled edges AS are provided at the free end of the connection line 6 in the region of the two protecting strips 17, 18 and the protecting portion 19, which beveled edges are indicated with dash-dot lines in FIG. 3.

It should be noted here that in a modification of the embodiment of the chip 2 as shown in FIG. 3 a single protecting strip is provided instead of two protecting strips 17, 18, which single strip has two sides whose positions correspond to the two sides 22 and 25 of the two protecting strips 17, 18 of the chip 2 of FIG. 3, thus covering the two mutually adjoining conductor portions 13, 14 of the modification of the embodiment of chip 2. In this modified embodiment of chip 2 according to FIG. 3, again, good results have been achieved as regards an avoidance of undesirable fracture zones and the resulting undesirable chip cracks.

Figure 5:
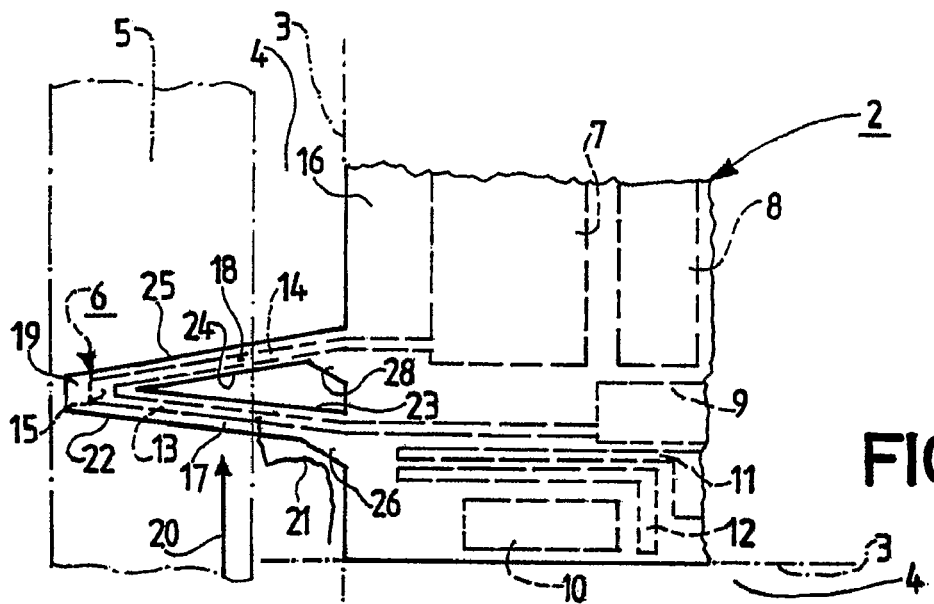
FIG. 5 shows in the same manner as FIG. 3 part of a chip in a second embodiment of the invention.

FIG. 5 shows a chip 2 in which again a connection line 6 with two conductor portions 13, 14 and a connecting portion 15 is provided, but here the two conductor portions 13, 14 and the connecting portion 15 substantially have a wedge shape. The two protecting strips 17, 18 are adapted correspondingly, and the protecting portion 19 is substantially given a wedge shape. In the chip 2 of FIG. 5, each protecting strip 17, 18 has a strip portion 26, 28 that is wider than the remaining portion of the protecting strip 17, 18 only at one side 22, 24 of the respective protecting strip 17, 18 in its region adjoining the planar protecting layer 16 of the chip 2. In this case, too, the two widened strip portions 26, 28 are triangular in shape, but here the triangles have different side lengths. As is apparent from FIG. 5, the widened strip portions 26, 28 are provided at those sides 22, 24 of the protecting strips 17, 18 that will be reached first by a saw blade when this saw blade is moved along the sawing lane 5 in the direction of arrow 20. This is because the greatest risk of a fracture zone being created exists where the saw blade hits against the protecting strips 17, 18 and against the conductor portions 13, 14.

It should finally be noted that the separation of the wafer 1 in the separating zones 4 along the sawing lanes 5 severs the connection lines 6 and accordingly interrupts them. This has the result that in an individual, completed chip 2 only remnants of the two conductor portions 13, 14 and of the two protecting strips 17, 18 will be present.

The invention claimed is:

1. A wafer comprising:
   chips having respective surface areas and chip boundaries; and
   elongate separating zones between the chips for breaking through the wafer and separating off the chips,
   wherein each chip includes at least one conductive connection line that projects from the boundary of the chip into a separating zone adjoining the chip, that is electrically conductive before a separation of the wafer in the adjoining separating zone, and that is interrupted upon a separation of the wafer in the adjoining separating zone, each of the conductive connection lines having two mutually adjoining conductor portions that are electrically interconnected by a connecting portion, and wherein each chip is covered with a planar protecting layer and the surface area of the planar protecting layer corresponds to the chip surface area, and wherein the wafer includes a protecting strip for each of the conductive connection lines, each of the protecting strips projecting from the planar protecting layer of the respective chip and covering the two mutually adjoining conductor portions, and each of the protecting strips having a portion that is wider than the remaining portion of the protecting strip at at least one side of the protecting strip in its region that adjoins the planar protecting layer.

2. A wafer comprising:
   chips having respective surface areas and chip boundaries, each chip covered with a planar protecting layer having a surface area that corresponds to the surface area of the chip; and
   elongate separating zones between the chips for breaking through the wafer and separating off the chips,
   wherein each chip includes at least one conductive connection line that projects from the boundary of the chip into a separating zone adjoining the chip, that is electrically conductive before a separation of the wafer in the adjoining separating zone, and that is interrupted upon a separation of the wafer in the adjoining separating zone, each of the conductive connection lines having two mutually adjoining conductor portions that are electrically interconnected by a connecting portion, and wherein the wafer includes two mutually adjoining protecting strips for each of the conductive connection lines, the two mutually adjoining protecting strips projecting from the planar protecting layer at the chip boundary of the respective chip and covering the two mutually adjoining conductor portions, the protecting strips connected to one another in the separating zone by a protecting portion that covers the connecting portion, and
   wherein each of the two protecting strips has a strip portion that is wider than the remaining region of the protecting strip at at least one side of the protecting strip in its region adjoining the planar protecting layer.

3. A wafer as claimed in claim 1, wherein each protecting strip has a strip portion that is wider than the remaining region of the protecting strip at both sides of the protecting strip in its region adjoining the planar protecting layer.

4. A wafer as claimed in claim 1, wherein each widened strip portion is realized in triangular form.

5. A wafer as claimed in claim 1, wherein a weak spot traversing the protecting strip is realized in each protecting strip.

6. A chip having a given chip surface area and chip Boundaries, the chip comprising:
- a remnant of at least one connection line, the remnant projecting from one of the chip boundaries and including remnants of two mutually adjoining conductor portions;
- a planar protecting layer covering the chip and having a surface area that corresponds to the chip surface area; and
- a remnant of at least one protecting strip, the remnant of the at least one protecting strip projecting from the planar protecting layer at the chip boundary and covering the remnants of the two mutually adjoining conductor portions and
- wherein the remnant of the at least one protecting strip has a strip portion that is wider than the remaining portion of the remnant at at least one side of the remnant in its region adjoining the planar protecting layer.

7. A chip having a given chip surface area and chip boundaries, the chip comprising:
- a remnant of at least one connection line, the remnant projecting from one of the chip boundaries and including remnants of two mutually adjoining conductor portions;
- a planar protecting layer covering the chip and having a surface area that corresponds to the chip surface area; and
- remnants of two mutually adjoining protecting strips, each of the remnants of the two mutually adjoining protecting strips projecting from the planar protecting layer at the chip boundary and covering one of the remnants of the two mutually adjoining conductor portions, and
- wherein each remnant of the two protecting strips has a strip portion that is wider than the remaining portion of said remnant at at least one side of the respective remnant in its region adjoining the planar protecting layer.

8. A chip as claimed in claim 6, wherein the remnant of each protecting strip has a strip portion that is wider than the remaining portion of said remnant on both sides of the remnant in its region adjoining the planar protecting layer.

9. A chip as claimed in claim 6, wherein each widened strip portion is given a triangular shape.

10. A chip as claimed in claim 6, wherein a weak spot is realized in the remnant of each protecting strip which weak spot traverses said remnant.

11. A wafer as claimed in claim 1, wherein each of the protecting strips completely covers the two mutually adjoining conductor portions of a respective one of the conductive connection lines.

12. A wafer comprising:
- chips having respective surface areas and chip boundaries, each chip covered with a planar protecting layer having a surface area that corresponds to the surface area of the chip;
- elongate chip separating zones between the chips for breaking through the wafer and separating off the chips;
- for each chip, at least one electrically conductive connection line having two conductor portions that project from the boundary of a respective chip into one of the separating zones adjoining the respective chip and that are connected in the adjoining separation zone by a connecting portion; and
- for each of the electrically conductive connection lines, a protecting portion that includes two protecting strips and a protecting connection strip that connects the two protecting strips to one another in the adjoining separating zone, the two protecting strips projecting from the planar protecting layer at the boundary of the respective chip and covering the two conductor portions, and the protecting connection strip covering the connecting portion, and
- wherein the two protecting strips each have a strip portion, adjoining the planar protecting layer of the respective chip, that is wider than the remaining portion of the protecting strip.

13. A wafer as claimed in claim 12, wherein the two protecting strips each completely cover a respective one of the two conductor portions.

14. A wafer as claimed in claim 12, wherein the strip portion of each of the two protecting strips is realized in triangular form.

15. A wafer as claimed in claim 12, wherein the two protecting strips each have a respective weak spot that traverses the protecting strips.

* * * * *